United States Patent [19]

Masuda

[11] 4,356,450
[45] Oct. 26, 1982

[54] OFFSET COMPENSATING CIRCUIT FOR OPERATIONAL AMPLIFIER

[75] Inventor: Eiji Masuda, Kawasaki, Japan

[73] Assignee: Tokyo Shibaura Denki Kabushiki Kaisha, Japan

[21] Appl. No.: 207,731

[22] Filed: Nov. 17, 1980

[30] Foreign Application Priority Data

Nov. 29, 1979 [JP] Japan .................. 54-154592

[51] Int. Cl.³ .................. H03F 1/02; H03F 3/45
[52] U.S. Cl. ...................... 330/9; 330/259; 330/290
[58] Field of Search .................. 330/9, 259, 290

[56] References Cited

U.S. PATENT DOCUMENTS 4,229,703 10/1980 Bustin .................. 330/9

OTHER PUBLICATIONS

Fullagar et al., Dual f.e.t.-input operational amplifier, Mar. 18, 1975, New Electronics.

D. Stout, Handbook of Operational Amplifier Circuit Design, pp. 2-3 to 2-5 (1976).

Primary Examiner—James B. Mullins
Assistant Examiner—Gene Wan
Attorney, Agent, or Firm—Finnegan, Henderson, Farabow, Garrett & Dunner

[57] ABSTRACT

Disclosed is an offset compensating circuit for an operational amplifier having its noninverting input terminal supplied with a compensating voltage corresponding to its output voltage obtained when its inverting input terminal is grounded. This offset compensating circuit includes a comparator connected to the output terminal of the operational amplifier and comparing the output voltage of the operational amplifier with a set voltage to deliver a binary signal corresponding to the result of such comparison, a pulse generator, an up-down counter for counting output pulses from the pulse generator in a count direction in accordance with the level of the output signal of the comparator, and a D/A converter for supplying the noninverting input terminal of the operational amplifier with a voltage corresponding to the count output of the up-down counter.

10 Claims, 12 Drawing Figures

OFFSET COMPENSATING CIRCUIT FOR OPERATIONAL AMPLIFIER

BACKGROUND OF THE INVENTION

This invention relates to an offset compensating circuit for an operational amplifier.

Presently operational amplifiers are used in a wide variety of fields. In one such operational amplifier, the output voltage will not entirely be reduced to zero even though its two input voltages are equal, leaving a fine offset voltage. In order to increase the precision of the operational amplifier, therefore, it is necessary to compensate such offset voltage. Prior art compensating circuits include a circuit which adjusts the balance of the primary-stage collector current of the operational amplifier by means of a variable resistor. Another compensating circuit is used with the operational amplifier where the amplifier serves as an inverting amplifier whose noninverting input terminal is grounded and whose inverting input terminal is supplied with an input voltage. For example, there is a circuit formed of a variable resistor and a resistor across which voltages $+V$ and $-V$ are applied, having its output terminal connected to the noninverting input terminal of the operational amplifier so that a voltage supplied to the noninverting input terminal may be adjusted by setting the variable resistor. Moreover, there is a circuit formed of a variable resistor and a resistor across which voltages $+V$ and $-V$ are applied, having its output terminal connected to the inverting input terminal of the operational amplifier so that a current supplied to the inverting input terminal may be adjusted by setting the variable resistor. With these circuits, the offset voltage can be compensated by setting the variable resistor so that the output voltage may become zero when the input voltage is zero.

When integrating the operational amplifier with such compensating circuit, however, it is difficult to perform offset compensation by manually operating the variable resistor. Thus, the manufacturing cost is increased, and such prior art compensating circuit is unsuited for an integrated circuit. Moreover, the resistance value of the variable resistor will vary with ambient conditions even after it is set, so that it will require resetting, lacking in reliability for integration.

SUMMARY OF THE INVENTION

The object of this invention is to provide an offset compensating circuit for an operational amplifier capable of automatically compensating any offset voltage, without requiring any manual operation and hence suitable for an integrated circuit.

The above object may be attained by an offset compensating circuit for an operational amplifier comprising a reference voltage terminal, an operational amplifier which is connected to receive a signal from the reference voltage terminal, comparing means connected to the output terminal of the operational amplifier and the reference voltage terminal to compare signals from these terminals and deliver a binary signal corresponding to the result of such comparison, means connected to the comparing means to generate a digital signal corresponding to the binary signal, and digital-to-analog converting means connected to the output terminal of the signal generating means and one input terminal of the operational amplifier to convert the digital signal into an analog signal to supply the input terminal of the operational amplifier.

DETAILED DESCRIPTION OF THE PREFERRED EMBODIMENTS

Now there will be described an offset compensating circuit for an operational amplifier according to an embodiment of this invention with reference to the accompanying drawings.

Figure 1:
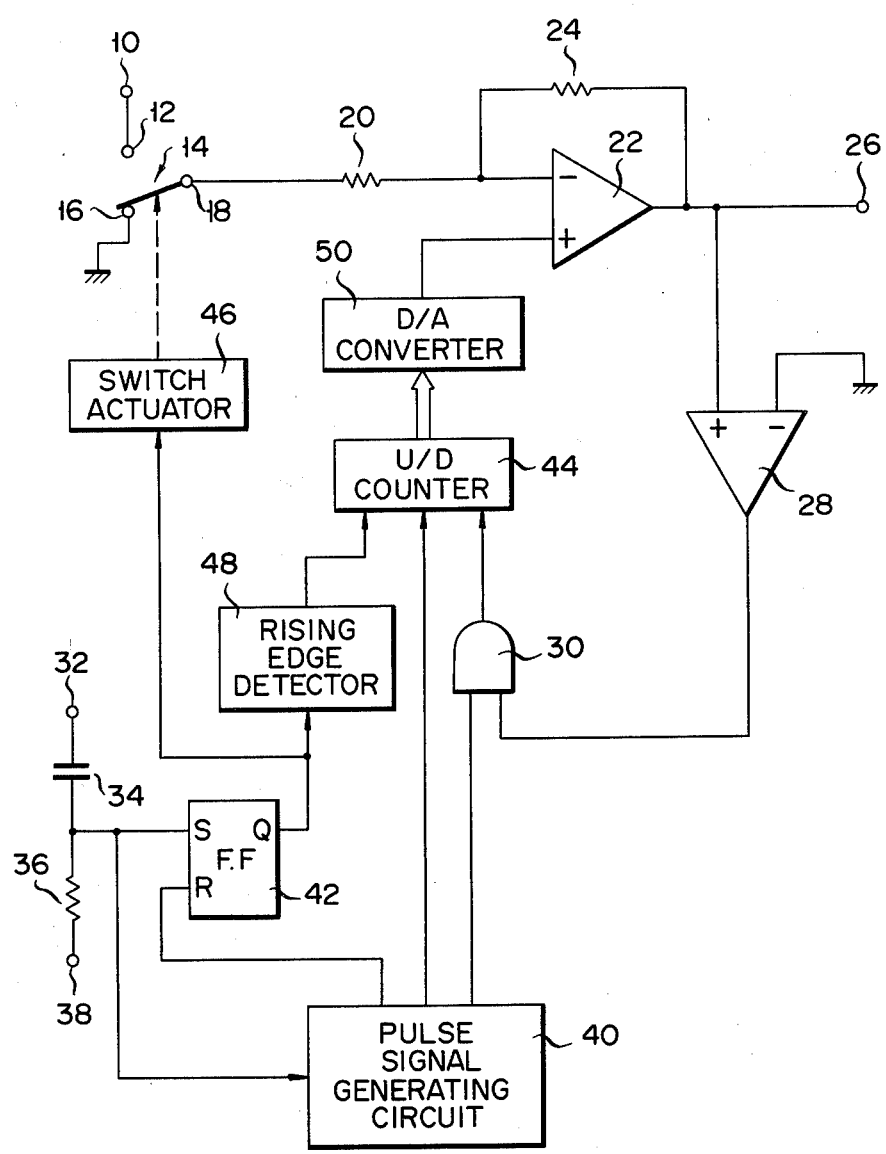
FIG. 1 is a block ciruit diagram of an offset compensating circuit for an operational amplifier according to a first embodiment of this invention.

FIG. 1 is a circuit diagram of an offset compensating circuit for an operational amplifier which is used as an inverting amplifier. An input terminal 10, supplied with a signal to be amplified, is connected to a first movable contact 12 of a switch 14. A second movable contact 16 of the switch 14 is grounded and kept at the ground potential as a reference potential. A fixed contact 18 of the switch 14 is connected to the inverting input terminal of an operational amplifier 22 through an input resistor 20. The switch 14 connects the input terminal 10 and the ground erminal to the inverting input terminal of the operational amplifier 22 when it is set to first and second positions, respectively.

The operational amplifier 22 has its output terminal connected to its inverting input terminal through a feedback resistor 24. The amplification degree of the operational amplifier 22 depends on the ratio between the resistance values of the input resistor 20 and the feedback resistor 24, resistor 24/resistor 20. In the present embodiment, the resistance values of the resistors 20, 24, are given as R and 100R, respectively. Namely, the operational amplifier 22 constitutes an inverting amplifier with an amplification factor of 100.

The output terminal of the opertional amplifier 22 is connected to an amplification signal output terminal 26 and the noninverting input terminal of a comparator 28. The inverting input terminal of the comparator 28 is grounded and kept at the ground potential as the reference potential. The inverting input terminal of the comparator 28 need not always be grounded, but only has to be at the same potential level as the second movable contact 16 of the switch 14. The output terminal of the comparator 28 is connected to one input terminal of an AND gate 30.

A positive power supply terminal 32 is connected to a negative power supply terminal 38 through a capacitor 34 and a resistor 36 connected in series. The junction between the capacitor 34 and the resistor 36 is connected to the source terminal of a pulse signal generating circuit 40 and the set terminal S of an RS flip-flop 42. The pulse signal generating circuit 40 produces pulse signals of three types: having its first output terminal is connected to the reset terminal R of the flip-flop 42, its second output terminal is connected to the other input terminal of the AND gate 30, and its third output terminal is connected to the input terminal of an up-down counter 44.

The output terminal of the AND gate 30 is connected to the count direction control terminal of the U/D counter 44. The Q-output terminal of the flip-flop 42 is connected to a switch actuator 46 and a rising edge detector 48. The switch actuator 46 changes the position of the switch 14.

The output terminal of the rising edge detector 48 is connected to the reset terminal of the U/D counter 44. The U/D counter 44 is a 6-bit binary counter, and the count output signals for six bits are supplied to a digital-to-analog converter 50. The output terminal of the D/A converter 50 is connected to the noninverting input terminal of the operational amplifier 22.

Figure 2:
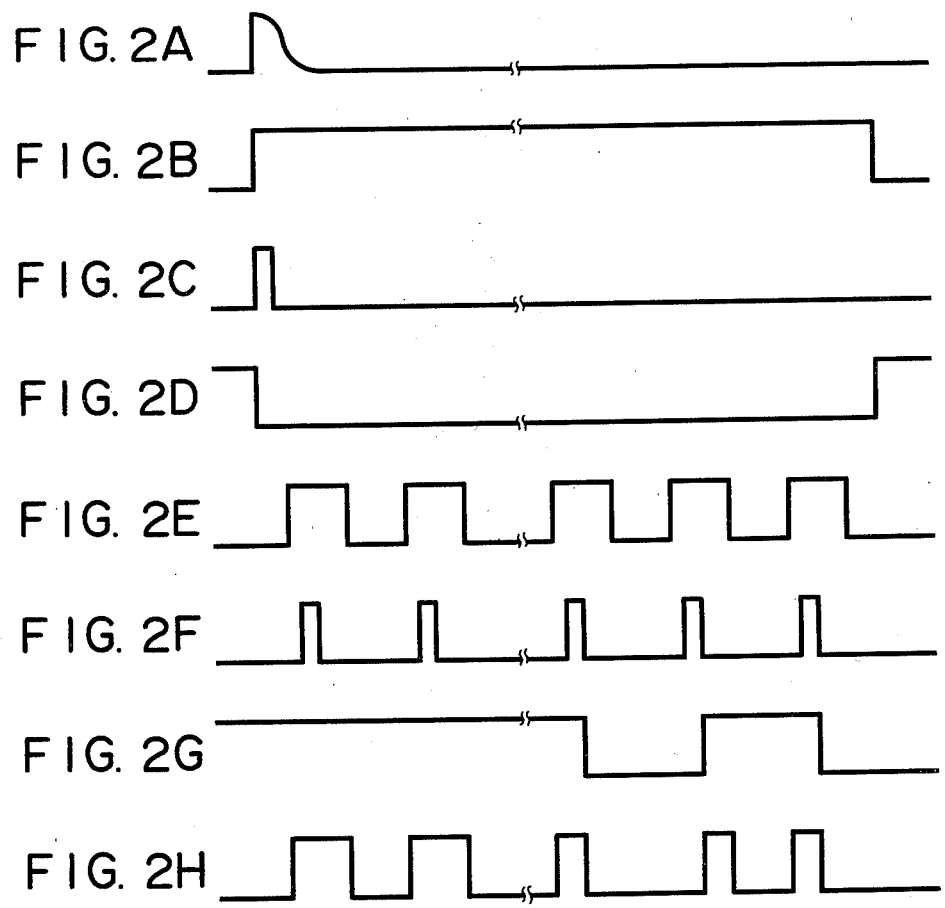
FIG. 2A and 2H are timing charts for illustrating the operation of the circuit of FIG. 1.

Referring now to the timing charts of FIGS. 2A to 2H, there will be described the operation of the aforementioned embodiment. When source voltage is supplied to the whole circuit to set the potentials of the positive and negative power supply terminals 32 and 38 to $+V$ and $-V$, respectively, the potential at the junction between the capacitor 34 and the resistor 36 instantaneously rises to $+V$, as shown in FIG. 2A. As a result, the flip-flop 42 is set, and the Q-output signal goes high, as shown in FIG. 2B.

The switch actuator 46 sets the switch 14 to the first and second positions when it is supplied with low- and high-level signals, respectively. In this case, ground voltage is applied to the inverting input terminal of the operational amplifier 22. Thus, the operational amplifier 22 starts an offset compensation cycle. The rising edge of the Q-outpu signal of the flip-flop 42 is detected by the rising edge detector 48, which then supplies such a pulse as shown in FIG. 2C to the reset terminal of the U/D counter 44. Accordingly, the U/D counter 44 is reset each time the circuit is supplied with the source voltage.

When the U/D counter 44 is reset, the count output signals for the six bits of the counter 44 are set to 1, 0, 0, 0, 0 and 0 in a descending order. The D/A converter 50 produces step voltages covering both positive- and negative-polarity ranges centering around the ground voltage as the reference voltage in accordance with the count output signals. For example, step voltages ranging from $+16$ mV through $0$ mV to $-16$ mV are delivered with every 0.5 mV. The D/A converter 50 delivered 0 mV when the count output signals give 100000.

When supplied with the source voltage, the pulse signal generating circuit 40 delivers from its first output terminal a first pulse signal which is kept at low level for a given period of time (100 ms in this embodiment) as shon in FIG. 2D and thereafter goes high, and delivers from its second and third output terminals for 100 ms second and third pulse signals with different pulse widths and the same period as shown in FIGS. 2E and 2F, respectively. Here the pulse width of the second pulse signal is longer than that of the third pulse signal. Although supplied to the reset terminal R of the flip-flop 42, the first pulse signal is kept at low level for the period of 100 ms, so that the flip-flop 42 is maintained in a set state for 100 ms.

Although the output voltage of the operational amplifier 22 ought to be the ground potential since both the inverting and noninverting input terminals of the amplier 22 are at the ground potential, it will never take the ground potential if there is an offset voltage. If the input and offset voltages are Vin and Vio respectively, the output voltage Vout equals $-100\text{Vin}+100\text{Vio}$, producing an error of 100Vio. Such output voltage is compared with the ground potential as the reference voltage by the comparator 28. If the input offset voltage Vio is specifically given by $\text{Vio}=+5.0$ mV, the output voltage of the operational amplifier 22 becomes $+500$ mV to exceed the reference voltage, so that the output signal of the comparator 28 goes high, as shown in FIG. 2G.

Since the output signal of the comparator 28 and the second pulse signal of the pulse signal generating circuit 40 as shown in FIG. 2E are supplied to the AND gate 30, the second pulse signal appears directly as the output signal of the AND gate 30 while the output signal of the comparator 28 is at high level, as shown in FIG. 2H. The U/D counter 44 serves as a down counter when a high-level signal is supplied to its control terminal, and as an up counter when supplied with a low-level signal. Therefore, when the output signal of the comparator 28 is at high level, that is, when the offset voltage of the operational amplifier 22 is positive, the U/D counter 44 performs down-counting. When one of pulses of the third pulse signal of the puls signal generating circuit 40 is supplied to the U/D counter 44, the count output signals give 011111, and the D/A converter 50 produces a voltage of $-0.5$ mV, with the result that the input voltage becomes 4.5 mV. Accordingly, the output voltage of the operational amplifier 22 thereafter becomes 450 mV, which is 100 times as high as that of the input voltage. Since the output signal of the comparator 28 still remains at high level as shown in FIG. 2G, the U/D counter 44 delivers 011110 in response to the third pulse signal subsequently applied thereto. As a result, the D/A converter 50 delivers $-1.0$ mV lower than $-0.5$ mV by 0.5 mV. Also in this case, the output voltage of the operational amplifier 22 does not become 0 mV.

Thereafter, the U/D counter 44 counts down the third pulse signal of the pulse signal generating circuit 40 inlike manner, and at the same time the output voltage of the D/A converter 50 is successively reduced from $-1.0$ mV to $-1.5$ mV, $-2.01$ mV,... by 0.51 mV. When the count output of the U/D counter 44 is reduced from the reset value 100000 by 10 to become 010110 so that the output voltage of the D/A converter 50 may be $-5.0$ mV, the offset voltage of $+5.0$ mV is cancelled by the output voltage of the D/A converter 50. Thus, the output voltage of the operational amplifier 22 becomes 0 mV, and the output signal of the comparator 28 is inverted to low level, as shown in FIG. 2G. Thereafter, despite the supply of the second pulse signal of the pulse signal generating circuit 40, the output signal of the AND gate is at low level as shown in FIG. 2H, and the U/D counter 44 serves as an up counter.

In consequence, when a subsequent pulse is supplied to the U/D counter 44, the count output becomes 010111, and the output voltage of the D/A converter 50 becomes $-4.5$ mV. Then, the output voltage of the operational amplifier 22 is given by $(5-4.5)\times 100=+50$ mV, and the output signal of the comparator 28 is returned to high level, as shown in FIG. 2G. Thereafter, the U/D counter 44 alternately repeats up-counting and down-counting with every input of one pulse, so that the output voltage of the D/A converter 50 oscillates between $-5.0$ mV and $-4.5$ mV.

After the passage of the given period of time (100 ms) from the time of the application of the power supply to the circuit, the first pulse signal of the pulse signal generating circuit 40 goes high, as shown in FIG. 2D, and the second and third pulse signals cease to be generated. Since the first signal is supplied to the reset terminal R of the flip-flop 42, the flip-flop 42 is reset to have its Q-output signal reduced to low level as shown in FIG. 2B. Accordingly, the switch actuator 46 transfers the switch 14 to the first position, thereby connecting the signal input terminal 10 with the inverting input terminal of the opertional amplifier 22.

When the pulse output of the pulse signal generating circuit 40 ceases to be delivered, the U/D counter 44 stops its counting operation. As a result, the count output of the U/D counter 44 remains 010110 or 010111, and the output voltage of the D/A converter 50 remains −5.0 mV or −4.5 mV. At the same time, the whole or part of the offset voltage of +5.0 mV in the operational amplifier 22 is cancelled by the output voltage of the D/A converter 50, and the output voltage of the operational amplifier 22 takes a value, which is substantially negatively 100 times as high as the input voltage thereof, including hardly any error. Thus, the offset compensation cycle of the operational amplifier 22 is completed, and an essential operating cycle of the amplifier as an inverting amplifier is started.

Although the offset voltage has been described as being positive, a negative offset voltage may be compensated in like manner. If there exists an offset voltage of −5 mV, for example, the U/D counter 44 counts up the third pulse signal of the pulse signal generating circuit 40 until the output voltage of the D/A converter 50 becomes +5.0 mV. Once the output voltage of the D/A converter 50 becomes +5.0 mV, it oscillates between +5.0 mV and 30 4.5 mV thereafter. In 100 ms after the supply of the source voltage, the U/D counter 44 stops its counting operation, and the output voltage of the D/A converter 50 is fixed to +5.0 mV or +4.5 mV to cancel the offset voltage.

It has been described herein that the first signal of the pulse signal generating circuit 40 is switched to high level to finish the offset compensation cycle in the given period of time of 100 ms after the supply of the source voltage. The time 100 ms is used for the following reason. If the time required for each count is 1 ms, the offset compensation cycle will be completed in 64 ms since the output voltage of the D/A converter 50 includes 64 steps at the most, that is, the count output of the U/D counter 44 gives 64 ($2^6$) counts at the most. Thus, taking some allowance into account, the offset compensation cycle will not fail to be over in 100 ms. Further, the bit number of the U/D counter 44 is not limited to six. The given period of time of 100 ms may vary with the bit number.

Thus, according to this embodiment, the offset voltage of the operational amplifier is automatically compensated with every supply of source voltage. Using the comparator and counter, the compensating circuit of this embodiment has improved reliability over prior art circuits since both these elements can be included in the integration of the operational amplifier.

Figure 3:
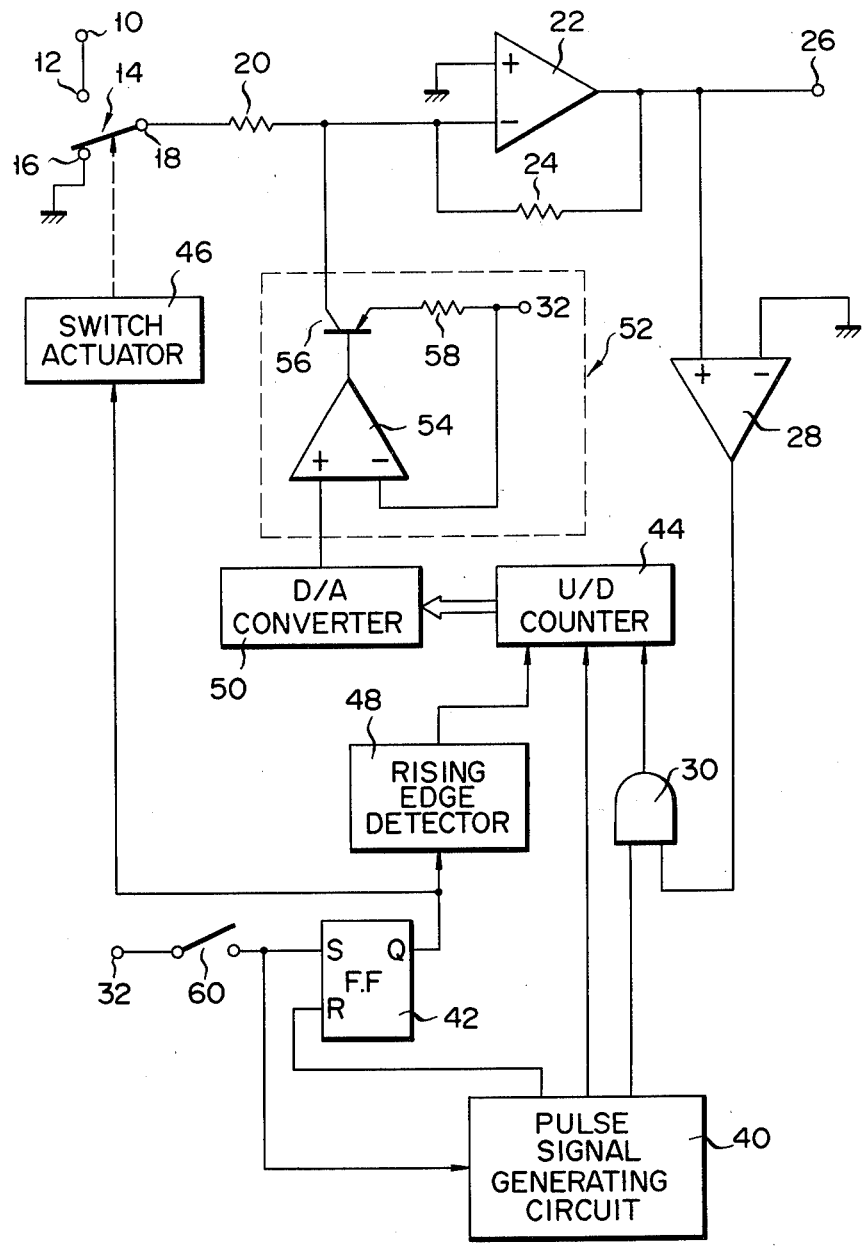
FIG. 3 is a block circuit diagram of a second embodiment of the invention.

Now there will be described an offset compensating circuit according to another embodiment of the invention. Like reference numerals are used to designate the same parts as shown in FIG. 1 throughout the drawings to follow, and detailed description of such parts is omitted herein. FIG. 3 shows this second embodiment. While the operational amplifier 22 is used as an inverting amplifier also in the second embodiment, the output voltage of the D/A converter 50 is connected to the inverting input terminal of the operational amplifier 22 through a voltage-to-current (V/I) converter 52. The noninverting input terminal of the operational amplifier 22 is grounded and kept at the reference voltage.

The output terminal of the D/A converter 50 is connected to the noninverting input terminal of an operational amplifier 54 whose output terminal is connected to the base of a PNP-type transistor 56. The emitter of the transistor 56 is connected to the inverting input terminal of the operational amplifier 54 through a resistor 58. The junction between the resistor 58 and the operational amplifier 54 is connected to the positive power supply terminal 32. The collector of the transistor 56 is connected to the inverting input terminal of the operational amplifier 22.

Also, the positive power supply terminal 32 is connected to the set terminal of the RS flip-flop 42 through a normally open set switch 60.

The waveforms of signals from the several parts of this embodiment are the same as the ones shown in the time charts of FIGS. 2A to 2H. In this embodiment, however, the offset voltage is compensated by causing a constant current to flow into the inverting input terminal of the operational amplifier 22. For example, if an offset voltage of +5.0 mV exists in the operational amplifier 22, and if the resistance values of the input resistor 20 and the feedback resistor 24 are 1 kΩ and 100 kΩ, respectively, then it is necessary only that a current of −5.0 μA be caused to flow into the inverting input terminal of the operational amplifier 22 in order to compensate the offset voltage.

Supposing that the U/D counter 44 and the D/A converter 50 have the same constructions as their respective counterparts in the first embodiment, the output current of the V/I converter 52 changes within a range from +16 μA to −16 μA by 0.5 μA with every change of the output of the U/D counter 44 by one count. In this embodiment, moreover, resetting of the U/D counter 44 by bringing the flip-flop 42 to its set state and the energization of the pulse signal generating circuit 40, that is, the start of the offset compensation cycle, is achieved by closing the set switch 60. Therefore, although it is impossible to perform offset compensation automatically with every supply the source voltage to the circuit, the offset compensation can be executed any time, e.g., during an operating cycle of the operational amplifier as an inverting amplifier, providing facility for the operation, especially in case of an increase in ambient temperature. Also in this embodiment, the offset compensation cycle time is set to 100 ms by the first signal of the pulse signal generating circuit 40, and the compensation cycle is automatically completed after the passage of 100 ms. It is generally known that the transistor 56 forming the V/I converter 52 is not limited to the PNP-type, and that as MOS FET may be used for that purpose without constituting any obstacle to the operation.

Figure 4:
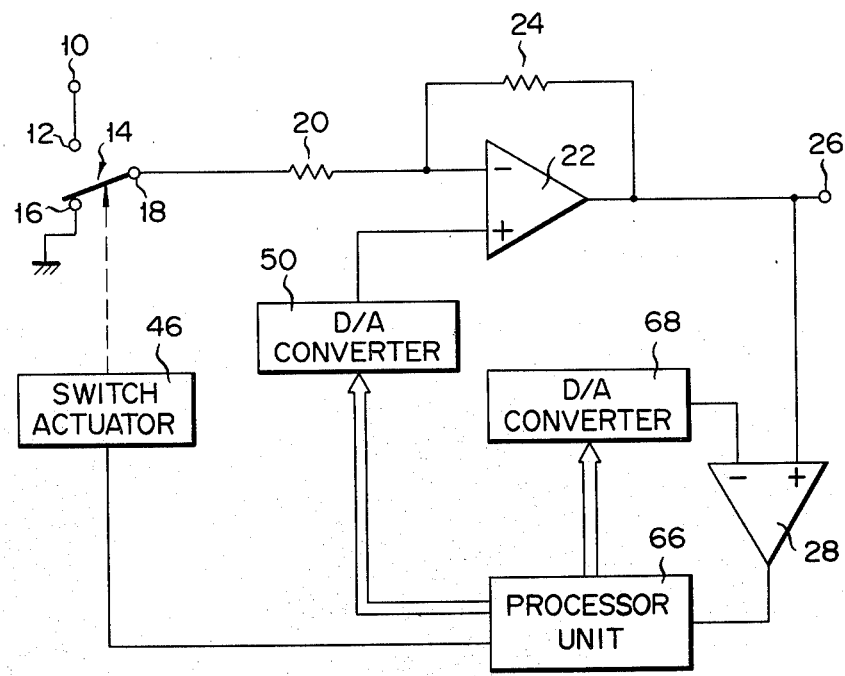
FIG. 4 is a block circuit diagram of a third embodiment of the invention.

FIG. 4 is a block diagram of a third embodiment of the invention. In this embodiment, a compensating voltage in digital amount is directly obtained by A/D converting an offset error voltage without using a counter. Although an A/D converter usually requires a number of comparators, the circuit of this embodiment includes a D/A converter and a single comparator. Namely, the output terminal of a comparator 28 is connected to the input terminal of a processor unit 66. An output signal from the processor unit 66 is supplied to D/A converters 50 and 68 and the switch actuator 46. The output terminal of the D/A converter 68 is connected to the inverting input terminal of the comparator 28. A microcomputer may be used for the processor unit 66.

When the source voltage is applied to the circuit of this embodiment, the processor unit 66 resets the D/A converter 50, and supplies the switch actuator 46 with a high-level signal to shift the switch 14 to its second position. At this time, if an offset voltage exists in the operational amplifier 22, the processor unit 66 supplies the D/A converter 68 with a digital signal required for the inversion of the output signal of the comparator 28. At the same time, the digital signal is supplied also to the D/A converter 50. If the output signal of the comparator 28 is inverted, the processor unit 66 goes on supplying the digital signal to the D/A converter 50, and supplies the switch actuator 46 with a low-level signal to return the switch 14 to its first position.

Figure 5:
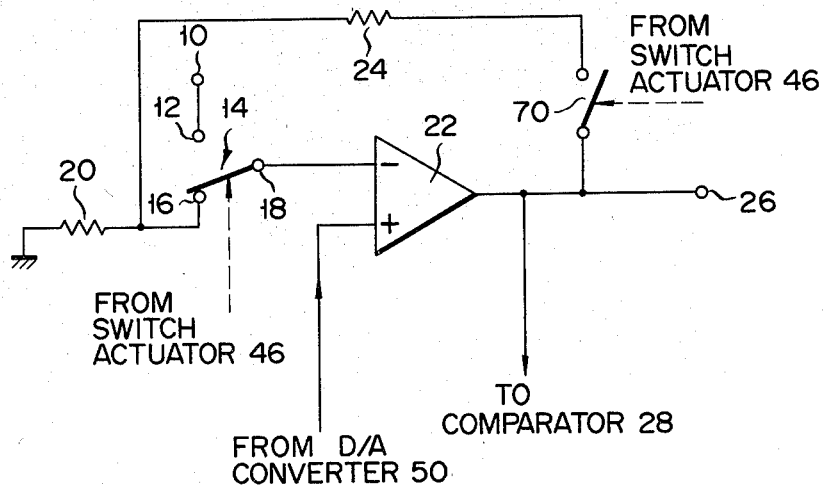
FIG. 5 is a block circuit diagram of a fourth embodiment of the invention.

All the aforementioned embodiments are examples of operational amplifiers which are each incorporated in a circuit, e.g., an inverting amplifier circuit. Referring now to FIG. 5, there will be described an embodiment to provide an offset-compensated, single-body operational amplifier. In this embodiment, the switch 14 and the input resistor 20 are connected in reverse sequence (with respect to the operational amplifier 22) to the connection sequence in the foregoing embodiments, and a switch 70 is interposed between the output terminal of the operational amplifier 22 and the feedback resistor 24. The switch 70, which is also controlled by the switch actuator 46, is closed and opened when the switch actuator 46 is supplied with high- and low-level signals, respectively.

Accordingly, when the switch 14 is set to the second position to ground the inverting input terminal of the operational amplifier 22, the switch 70 is closed, and the offset voltage is compensated in the same manner as the foregoing embodiments. When the offset compensation is completed and the switch 14 takes the first position, the switch 70 is opened, so that the operational amplifier 22 is disconnected from the feedback resistor 24 and the input resistor 20. Thus, there is provided a single-body operational amplifier whose offset voltage is compensated.

It will easily be understood that the operational amplifier according to this invention can be compensated for its offset voltage without regard to the circuit configuration of the amplifier. Namely, the operational amplifier may be of any type including an inverting amplifier, a noninverting amplifier, a differentiation amplifier, and an integration amplifier.

Although in the above-mentioned embodiments the operational amplifier is operated in a feedback loop which includes feedback resistor 24 in the offset compensation cycle, it is to be understood that the same effect may be obtained if the resistance value of the feedback resistor 24 is infinitely great, that is, if the operational amplifier is operated in an open loop.

What is claimed is:

1. An offset compensating circuit for an operational amplifier having two input terminals comprising:
   a reference voltage terminal connectable to a first input terminal;
   comparing means connected to the output terminal of said operational amplifier and to said reference voltage terminal for comparing signal levels at both said terminals and generating a two-level signal indicating the result of said comparison;
   counting means connected to said comparing means for generating a digital count at an output terminal in response to the state of said two-level signal; and
   a digital-to-analog converter having an input terminal connected to the output terminal of said counting means and and having an output terminal connected to a second input terminal of said operational amplifier to supply said operational amplifier with an analog signal corresponding to said count to compensate for voltage offset in said operational amplifier.

2. An offset compensating circuit according to claim 1, wherein said counting means includes a pulse generator and an up-down counter for counting output pulses from said pulse generator in a count direction determined by the state of said two-level signal.

3. An offset compensating circuit according to claim 1, further comprising a switching circuit for generating a start signal and a stop signal, and a switch whose first movable contact is connected to said reference voltage terminal, whose second movable contact is connected to a signal input terminal, and whose fixed contact is connected to said first input terminal of said operational amplifier, so that said first and second movable contacts may be connected with said fixed contact in response to said start and stop signals, respectively.

4. An offset compensating circuit according to claim 3, wherein said switching circuit is formed of a flip-flop and delivers said start and stop signals when set and reset, respectively.

5. An offset compensating circuit according to claim 4, wherein said flip-flop is set in response to a signal resulting from the turning on of a power source.

6. An offset compensating circuit according to claim 4, wherein said flip-flop is set in response to a closing of a set switch connected between the set terminal of a flip-flop and said power source.

7. An offset compensating circuit according to claim 5 or 6, wherein said counting means includes a pulse generating circuit energizing in response to said start signal to supply a first pulse signal to the reset terminal of said flip-flop after a given period of time and, for said given period of time, to supply a second pulse signal and a third pulse signal the width of pulses of said third pulse signal being shorter than those of said second pulse signal, an AND gate having as inputs the output signal of said comparing means and said third pulse signal, and an up-down counter having a reset terminal supplied with said stop signal, a count direction control terminal supplied with an output signal from said AND gate and an input terminal supplied with said second pulse signal, whereby said counter counts the pulses of said second pulse signal.

8. An offset compensating circuit according to claim 7, wherein said pulse generating circuit is de-energized in response to a change of the output signal of said comparing means to stop the generation of said first, second and third pulse signals.

9. An offset compensating circuit according to claim 8, wherein the output terminal of said operational amplifier is connected to one input terminal of said operational amplifier through a switch which is closed and opened in response to said start and stop signals, respectively.

10. An offset compensating circuit comprising:
   a reference voltage terminal;

an operational amplifier having two input terminals, a first one of which is connected to receive a signal from said reference voltage terminals;

comparing means having a first input terminal connected with the output terminal of said operational amplifier, having a second input connected to a comparison signal, said comparing means generating a two-level signal at an output terminal;

computing means connected to the output terminal of said comparing means to deliver first and second digital signals at first and second output terminals, respectively, in response to the state of said two-level signal;

a first D/A converter connected between the first output terminal of said computing means and the second input terminal of said comparing means to supply the second input terminal of said comparing means with said comparison signal corresponding to an output signal of said computing means; and a second D/A converter connected between the second output terminal of said computing means and a second input terminal of said operational amplifier to supply said operational amplifier with an analog signal corresponding to a second output signal of said computing means to compensate for voltage offset in said operational amplifier.

* * * * *